United States Patent
Ying et al.

(10) Patent No.: US 6,911,346 B2
(45) Date of Patent: Jun. 28, 2005

(54) METHOD OF ETCHING A MAGNETIC MATERIAL

(75) Inventors: Chentsau Ying, Cupertino, CA (US); Xiaoyi Chen, Foster City, CA (US); Mohit Jain, San Jose, CA (US); Ajay Kumar, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/394,464

(22) Filed: Mar. 21, 2003

(65) Prior Publication Data

US 2003/0219984 A1 Nov. 27, 2003

Related U.S. Application Data

(60) Provisional application No. 60/369,782, filed on Apr. 3, 2002.

(51) Int. Cl.$^7$ .............................................. H01L 21/00
(52) U.S. Cl. ......................... 438/3; 438/689; 438/694; 438/706; 438/710
(58) Field of Search ............................. 438/3, 710, 694, 438/706, 689; 257/296, 421, 414

(56) References Cited

U.S. PATENT DOCUMENTS

| | | | |
|---|---|---|---|
| 4,411,757 A | 10/1983 | Kitada et al. ............ | 204/192 E |
| 4,439,294 A | 3/1984 | Willibrordus et al. | |
| 5,589,263 A | 12/1996 | Ueda et al. ................. | 428/336 |
| 5,867,890 A | 2/1999 | Hsiao et al. ............. | 29/603.14 |
| 6,024,885 A | 2/2000 | Resnick et al. | |
| 2003/0170985 A1 * | 9/2003 | Hwang et al. .............. | 438/689 |

FOREIGN PATENT DOCUMENTS

| | | | |
|---|---|---|---|
| EP | 0 889 506 | 1/1999 | .......... H01L/2/311 |
| GB | 2 331 273 A | 5/1999 | |

OTHER PUBLICATIONS

Jung, et al., "Development of electron cyclotron resonance and inductively couled plasma high density plasma etching for patterning of NiFeCo," J. Vac. Sci. Technol. A, 16(3), May/Jun. 1998, 1697–1701.

Jung, et al., "High rate dry etching of $Ni_{0.8}Fe_{0.2}$ and NiFeCo," Appl. Phys. Lett, 71(9), Sep. 1, 1997, 1255–1257.

Jung, et al., "Relative merits of $Cl_2$ and $CO/NH_3$ plasma chemistries for dry etching of magnetic random access memory device elements," Journal of Applied Phys. 85(8), Apr. 15, 1999, 4788–4790.

Cho et al., "Corrosion–Free Dry Etch Patterning of Magnetic Random Access Memory Stacks: Effects of Ultraviolet Illumination", Journal of Applied Physics, American Institute of Physics, XP–000954014, vol. 87, No. 9, May 1, 2000, pp., 6397–6399.

Van Delft et al., "The Etch Mechanisms of Magnetic Materials in an HCl Plasma", Journal of Nuclear Materials, XP008022404, 1993 pp. 366–370.

* cited by examiner

Primary Examiner—Hsien Ming Lee
(74) Attorney, Agent, or Firm—Moser, Patterson & Sheridan, LLP; Joseph Bach

(57) ABSTRACT

A method of etching a magnetic material (e.g., nickel-iron alloy (NiFe), cobalt-iron alloy (CoFe), and the like) using a gas mixture comprising a hydrogen halide gas and a fluorocarbon-containing gas is disclosed. The method provides high etch selectivity for the magnetic materials over non-magnetic dielectric materials, such as aluminum oxide ($Al_2O_3$) and the like, as well as to photoresist.

38 Claims, 6 Drawing Sheets

METHOD OF ETCHING A MAGNETIC MATERIAL

CROSS-REFERENCE TO RELATED APPLICATIONS

This application claims benefit of U.S. provisional patent application Ser. No. 60/369,782, filed Apr. 3, 2002, which is herein incorporated by reference.

BACKGROUND OF THE INVENTION

1. Field of the Invention

The present invention generally relates to a method for fabricating devices on semiconductor substrates. More specifically, the present invention relates to a method of etching magnetic materials.

2. Description of the Related Art

Microelectronic devices are generally fabricated on a semiconductor substrate as integrated circuits wherein various conductive layers are interconnected to one another to facilitate propagation of electronic signals within the device. An example of such a device is a storage element in memories such as magneto-resistive random access memories (MRAM) that facilitate storage of digital information.

A memory cell in a MRAM device is a multi-layered structure comprising two sets of magnetic layers that are separated by a non-magnetic dielectric material. These layers are deposited as overlying blanket films, and then patterned to form the MRAM device. More specifically, the MRAM device comprises a top electrode (e.g., tantalum (Ta), tantalum nitride (TaN), and the like), a free magnetic layer (e.g., NiFe, CoFe, and the like), a tunnel layer (e.g., $Al_2O_3$ and the like), a multi-layer magnetic stack comprising layers of NiFe, ruthenium (Ru), CoFe, PtMn, NiFeCr, and the like, a bottom electrode (e.g., Ta, TaN, and the like), and a barrier layer (e.g., $SiO_2$ and the like).

Fabrication of a MRAM device comprises plasma etching processes in which one or more layers of a MRAM film stack are removed, either partially or in total. The MRAM film stack comprises materials that are sensitive to corrosion and may be easily oxidized, eroded, or damaged during etching, as well as develop difficult to remove metal-containing residues. These problems arise from low etch selectivity and non-volatile nature of by-products that form during the etch processes. Such residues generally build up along the sides of the MRAM film stack and may form a veil-like pattern. The conductive residues or eroded layers may cause electrical short-circuits within the MRAM film stack.

The magnetic materials are generally etched using a chlorine (Cl) based chemistry that has low etch selectivity for the magnetic material (e.g., NiFe, CoFe, and the like) over the material of the tunnel layer (e.g., $Al_2O_3$ and the like) and photoresist. As a result of this low etch selectivity, the etch processes require use of a hard mask and may simultaneously etch both the top magnetic layer and tunnel layer, thereby exposing the sidewalls of the tunnel layer to plasma erosion and deposition of conductive residues. Application and removal of the hard etch mask are time consuming routines that decrease productivity and increase the costs of fabricating the MRAM devices. Additionally, the eroded tunnel layer or conductive residues may cause electrical short-circuits within the MRAM device (e.g., between the magnetic layers separated by the tunnel layer), or may cause the MRAM device to operate sub-optimally or not at all.

Therefore, there is a need in the art for an improved method of etching magnetic materials for fabrication of a magneto-resistive random access memory (MRAM) device.

SUMMARY OF THE INVENTION

The present invention is a method of etching a magnetic material (e.g., nickel-iron alloy (NiFe), cobalt-iron alloy (CoFe), and the like) using a gas mixture comprising a hydrogen halide gas and a fluorocarbon-containing gas. The method provides high etch selectivity for the magnetic materials over non-magnetic dielectric materials, such as aluminum oxide ($Al_2O_3$) and the like, as well as to photoresist.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method of etching a magnetic material (e.g., nickel-iron alloy (NiFe), cobalt-iron alloy (CoFe), and the like) using a gas mixture comprising a hydrogen halide gas and a fluorocarbon-containing gas. The method provides high etch selectivity for the magnetic materials over non-magnetic dielectric materials, such as aluminum oxide ($Al_2O_3$) and the like, as well as to photoresist.

Figure 1:
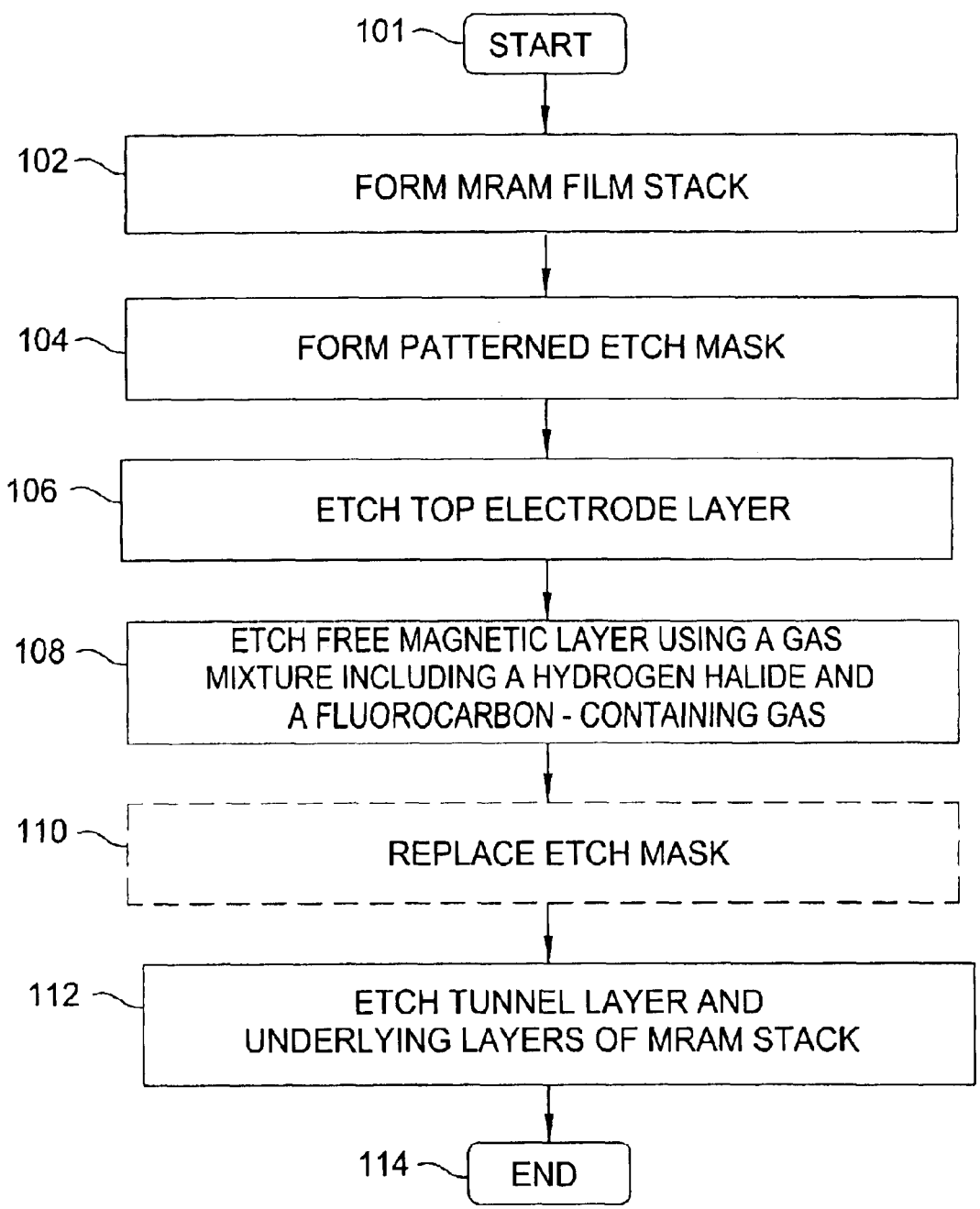
FIG. 1 depicts a flow diagram of a method of etching a magnetic material in accordance with an embodiment of the present invention.

FIG. 1 depicts a flow diagram of one embodiment of the inventive method for etching a magnetic material as sequence 100. The sequence 100 includes the processes that are performed upon a magneto-resistive random access memory (MRAM) film stack during fabrication of the MRAM device.

FIGS. 2A–2F depict a series of schematic, cross-sectional views of a substrate comprising a MRAM device being formed using the sequence 100. To best understand the invention, the reader should simultaneously refer to FIGS. 1 and 2A–2F. The cross-sectional views in FIGS. 2A–2F relate to the process steps that are used to form the MRAM device. Sub-processes and lithographic routines (e.g., exposure and development of photoresist, wafer cleaning procedures, and the like) are well known in the art and, as such, are not shown in FIG. 1 and FIGS. 2A–2F. The images in FIGS. 2A–2F are not depicted to scale and are simplified for illustrative purposes.

Figure 2A:
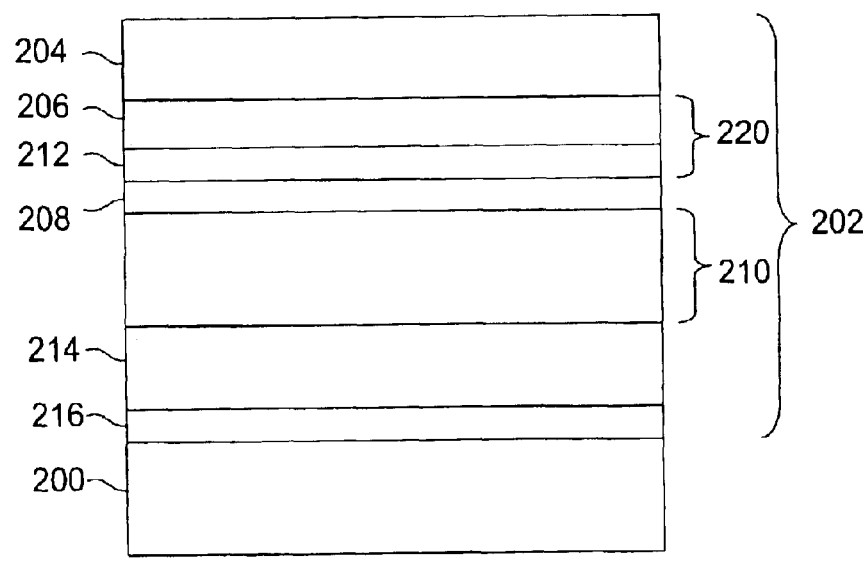
FIGS. 2A–2F depict a sequence of schematic, cross-sectional views of a substrate having a MRAM film stack being formed in accordance with the method of FIG. 1.

The sequence 100 starts at step 101 and proceeds to step 102, when a MRAM film stack 202 is formed on a substrate 200, such as a silicon (Si) wafer and the like (FIG. 2A). In one embodiment, the MRAM film stack 202 comprises a top electrode layer 204, a free magnetic layer 220, a tunnel layer 208, a multi-layer magnetic stack 210, a bottom electrode layer 214, and a barrier layer 216.

The top electrode layer 204 and bottom electrode layer 214 are generally formed of a conductive material, such as tantalum (Ta), tantalum nitride (TaN), copper (Cu), and the like to a thickness of about 100–600 Angstroms. The free magnetic layer 220 may comprise one or more sub-layers 206, 212 such as nickel-iron (NiFe) alloy, cobalt-iron (CoFe) alloy, and the like to a thickness of about 20–200 Angstroms.

The tunnel layer 208 forms a magnetic tunnel junction of the MRAM device and is composed of a non-magnetic dielectric material, such as alumina ($Al_2O_3$) and the like. Generally, the tunnel layer 208 has a thickness of about 10–30 Angstroms. The magnetic stack 210 may comprise a plurality of magnetic layers, such as films of CoFe, Ru, Cofe, PtMn or IrMn, NiFe, NiFeCr, and the like having a thickness of 20, 8, 20, 200, 10, and 30 Angstroms, respectively. The barrier layer 216 is generally formed from a dielectric material, such as silicon dioxide ($SiO_2$), silicon nitride ($Si_3N_4$), and the like to a thickness of about 100–500 Angstroms. It should be understood that, in other embodiments, the MRAM film stack 202 may comprise layers that are formed from different materials.

The layers of the MRAM film stack 202 can be formed using any conventional thin film deposition technique, such as atomic layer deposition (ALD), physical vapor deposition (PVD), chemical vapor deposition (CVD), plasma enhanced CVD, and the like. Fabrication of the MRAM devices may be performed using the respective processing reactors of CENTURA®, ENDURA®, and other semiconductor wafer processing systems available from Applied Materials, Inc. of Santa Clara, Calif.

Figure 2B:
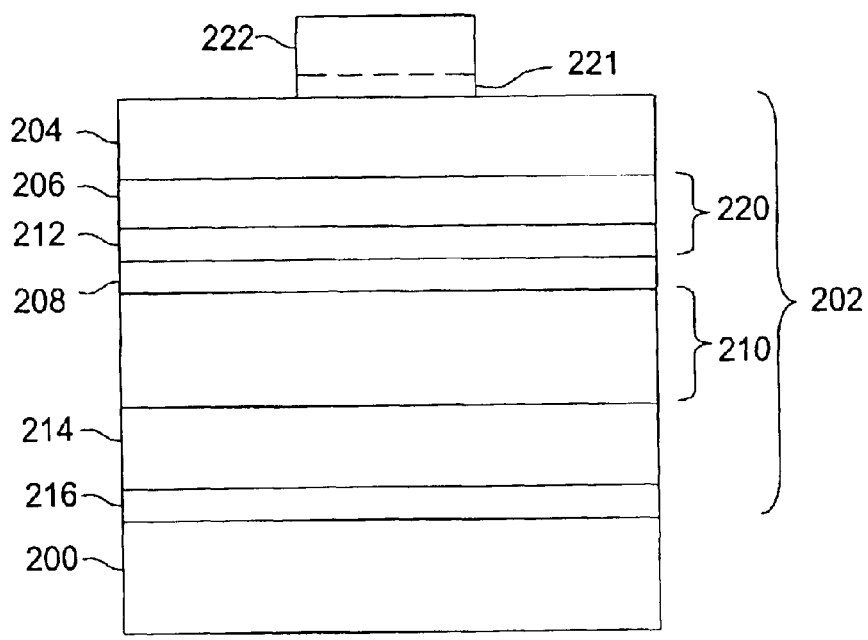
Figure 2C:
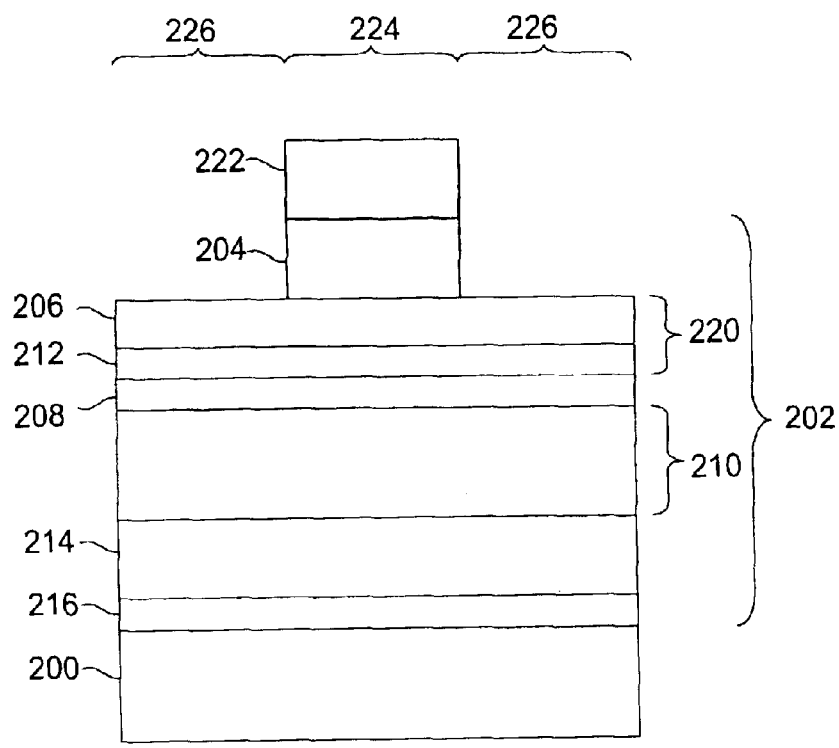

At step 104, a mask 222 is formed on the top electrode layer 204 of MRAM film stack 202 (FIG. 2B). The mask 222 defines location and topographic dimensions for the MRAM devices being fabricated. In the depicted embodiment, the mask 222 protects region 224 of the MRAM film stack 202 and exposes adjacent regions 226 thereof. In one exemplary embodiment, the mask 222 is a patterned photoresist mask. Alternatively, the mask 222 may be a hard mask composed of, e.g., Advanced Patterning Film™ (APF) (available from Applied Materials, Inc. of Santa Clara, Calif.), silicon dioxide ($SiO_2$), hafnium dioxide ($HfO_2$), and the like.

Additionally, the mask 222 may optionally comprise an anti-reflective layer 221 (shown with dashed lines in FIG. 2B) that controls the reflection of light used to expose the photoresist. As feature sizes are reduced, inaccuracies in an etch mask pattern transfer process can arise from optical limitations that are inherent to the lithographic process, such as the light reflection. The anti-reflective layer may comprise, for example, silicon nitride (SiN), polyamides, and the like.

Processes of applying the mask 222 are described, for example, in commonly assigned U.S. patent applications Ser. No. 10/218,244, filed Aug. 12, 2002, Ser. No. 09/590, 322, filed Jun. 8, 2000, and Ser. No. 10/245,130, filed Sep. 16, 2002, which are incorporated herein by reference.

At step 106, the top electrode layer 204 is plasma etched using, e.g., a fluorine-based gas mixture. During step 106, the top electrode layer 204 is removed in the unprotected regions 226. In one embodiment, step 106 uses the photoresist mask 222 as an etch mask and the free magnetic layer 220 as an etch stop layer. Specifically, during etching of the Ta or TaN top electrode layer 204, the endpoint detection system may monitor plasma emissions at a wavelength of about 3630 Angstroms to determine that the top electrode layer 204 has been removed in the regions 226.

Step 106 can be performed in an etch reactor such as a Decoupled Plasma Source (DPS) II module of the CENTURA® system. The DPS II module (described in detail in reference to FIG. 3 below) uses a 2 MHz inductive source to produce a high-density plasma.

In one illustrative embodiment, a top electrode layer 204 comprising Ta/TaN is etched in the DPS II module by providing carbon tetrafluoride ($CF_4$) at a rate of 40 to 80 sccm, trifluoromethane ($CHF_3$) at a rate of 10 to 30 sccm (i.e., a $CF_4$:$CHF_3$ flow ratio ranging from 4:3 to 8:1), argon (Ar) at a rate of 40 to 80 sccm, applying power to the inductively coupled antenna between 200 to 3000 W, applying a cathode bias power between 0 to 300 W, and maintaining a wafer temperature of about 15 to 80 degrees Celsius at a pressure in the process chamber of between 5 to 40 mTorr. One illustrative process provides $CF_4$ at a rate of 60 sccm, $CHF_3$ at a rate of 20 sccm (i.e., a $CF_4$:$CHF_3$ flow ratio of about 3:1), Ar at a rate of 60 sccm, applies 1000 W of power to the antenna, 50 W of bias power, a wafer temperature of 80 degrees Celsius, and a pressure of 10 mTorr. Such a process provides etch selectivity for Ta/TaN (layer 204) over NiFe or CoFe (layer 220) of at least 50:1, as well as etch selectivity for Ta/TaN over the photoresist (mask 222) of about 0.5:1.

Figure 2D:
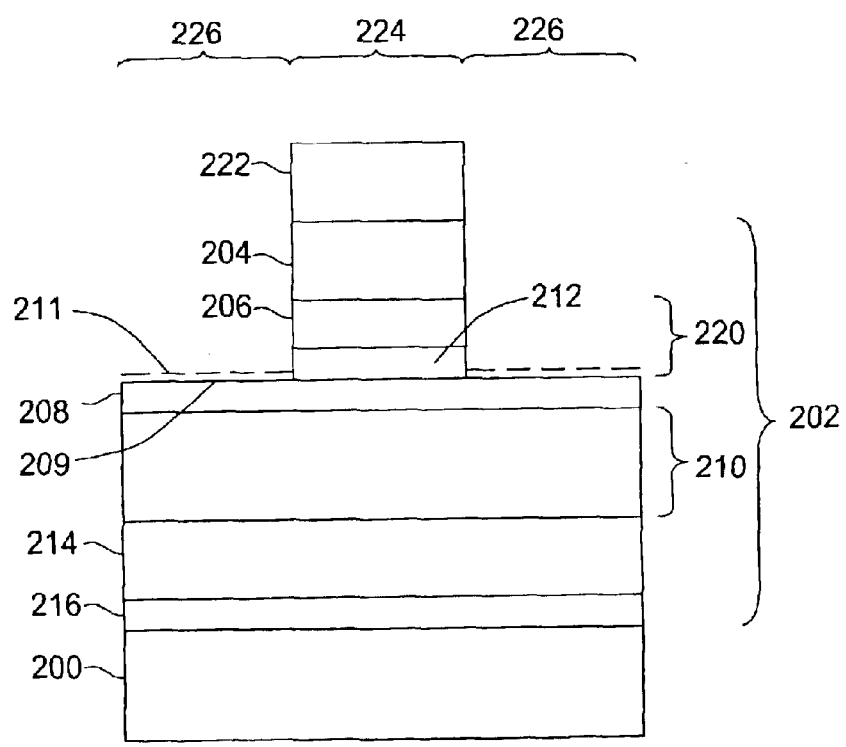
Figure 2E:
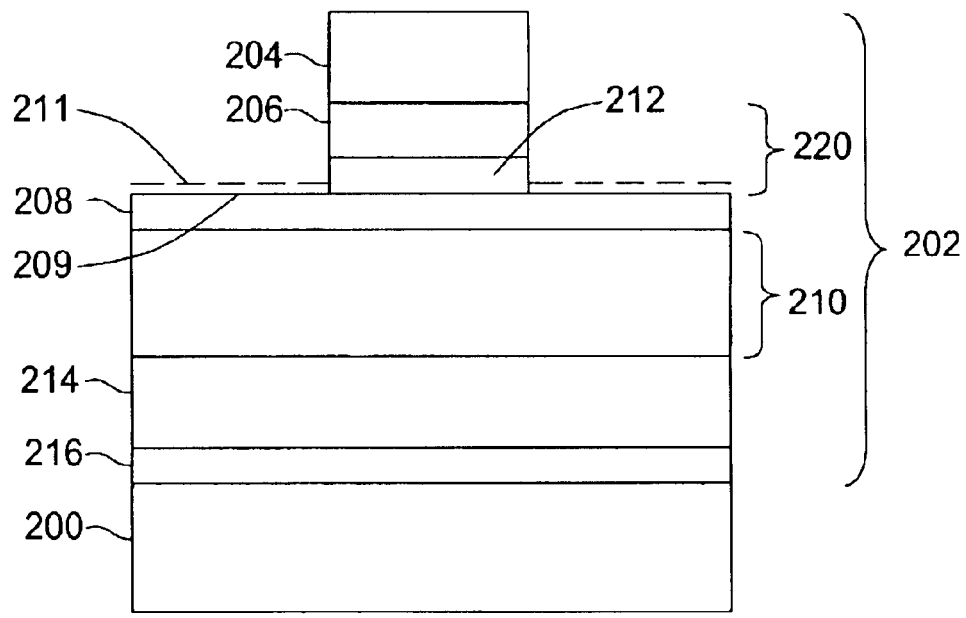

At step 108, the free magnetic layer 220 (e.g., NiFe film 206, CoFe film 212, and the like) is plasma etched and removed in the unprotected regions 226 (FIG. 2D). In one embodiment, step 108 uses a gas mixture comprising a hydrogen halide gas and a fluorocarbon-containing gas, along with an inert diluent gas, such as at least one of argon (Ar), helium (He), neon (Ne), and the like. The hydrogen halide gas may comprise hydrogen bromide (HBr), hydrogen chloride (HCl), hydrogen fluoride (HF), and the like. The fluorocarbon-containing gas may comprise carbon tetrafluoride ($CF_4$), trifluoromethane ($CHF_3$), difluoromethane ($CH_2F_2$), fluoromethane ($CH_3F$) and the like. Step 108 uses the photoresist mask 222 as an etch mask and may use a protective film 211 that is formed on the tunnel layer 208 during etching as an etch stop layer. To determine the endpoint of the etch process, the etch reactor may use an endpoint detection system to monitor plasma emissions at a particular wavelength (e.g., at about 3736 Angstroms), laser interferometry, control of process time, and the like.

During step 108, the etchant gas mixture is selected such, that the mixture facilitates high etch selectivity for the magnetic material (e.g., NiFe, CoFe, and the like) comprising the free magnetic layer 220 over the non-magnetic dielectric material (e.g., $Al_2O_3$ and the like) of the tunnel layer 208, as well as over the photoresist (mask 222).

More specifically, the fluorocarbon-containing gas increases the etch selectivity for the magnetic material over the dielectric material, and the hydrogen halide gas increases the etch selectivity for the magnetic material over the photoresist. Additionally, the fluorine-containing gas forms a thin protective film 211 of hard aluminum-fluoride compounds having a chemical structure $AlF_X$ on a surface 209 of the $Al_2O_3$ tunnel layer 208. The $AlF_X$ compounds are substantially chemically inert towards the reactive species present in the plasma of the etchant gas mixture used during step 108. Generally, a thickness of the protective film 211 is about 10 to 20 Angstroms. Further, high etch selectivity of the etchant gas mixture over the photoresist minimizes the top electrode erosion, which may degrade the device performance.

The protective film 211 protects the tunnel layer 208 from etching and facilitates high selectivity for etching the magnetic material over aluminum oxide or similar materials. Since the protective film 211 is thin, this film may be easily removed during a subsequent tunnel layer 208 etch process.

Step 108 advantageously preserves the continuity of the tunnel layer near the MRAM film stack 202 because of the formation of the protective film 211. Further, since only the magnetic stack 220 is etched, the edge of the tunnel layer 208 is not exposed to a corrosive plasma or conductive post-etch residues. As such, conductive residues are not formed in a manner that a short circuit may occur between the top and bottom magnetic layers of the MRAM film stack 202 (i.e., a short circuit across the tunnel layer 208).

In one illustrative embodiment, the free magnetic layer 220 comprising NiFe and CoFe is etched in the DPS II module by providing a hydrogen halide gas, e.g., hydrogen bromide (HBr) at a rate of 40 to 80 sccm, a fluorocarbon-containing gas, e.g., carbon tetrafluoride ($CF_4$) at a rate of 10 to 40 sccm (i.e., a hydrogen halide:fluorocarbon-containing gas flow ratio ranging from 1:1 to 8:1), argon (Ar) at a rate of 10 to 40 sccm, applying power to the inductively coupled antenna between 200 to 3000 W, applying a cathode bias power between 50 to 300 W, and maintaining a wafer temperature of about 15 to 80 degrees Celsius at a pressure in the process chamber of between 5 to 40 mTorr. One illustrative etch process provides HBr at a rate of 60 sccm, $CF_4$ at a rate of 20 sccm (i.e., a HBr:$CF_4$ flow ratio of about 3:1), Ar at a rate of 20 sccm, applies 1000 W of power to the antenna, 100 W of bias power, a wafer temperature of 40 degrees Celsius, and a pressure of 8 mTorr. Such a process provides etch selectivity for NiFe or CoFe (layer 220) over $Al_2O_3$ (layer 208) of at least 15:1, as well as etch selectivity for NiFe or CoFe over the photoresist (mask 222) of about 0.2:1.

At step 110, the mask 222 is optionally removed (or stripped) (FIG. 2E) and then replaced with a new etch mask (not shown). The new etch mask may be either of a photoresist or hard mask. The processes that are used to reapply the new mask are the same as described above with reference to the mask 222. When the mask 222 is not removed it is used during subsequent processing steps.

Figure 2F:
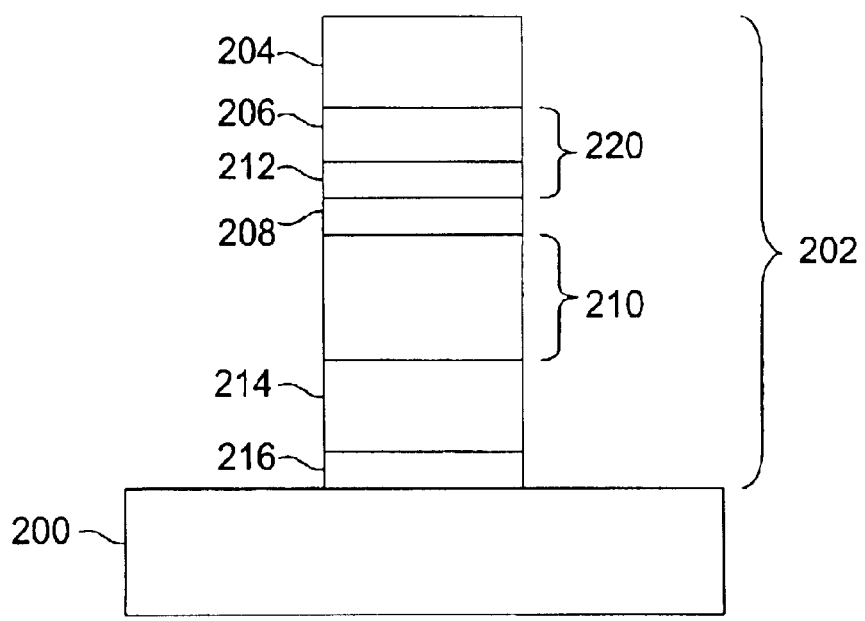

In one illustrative embodiment, the mask 222 comprising photoresist is stripped in the DPS II module by providing oxygen ($O_2$) at a rate of 10 to 100 sccm, nitrogen ($N_2$) at a rate of 10 to 100 sccm (i.e., a $O_2$:$N_2$ flow ratio ranging from 1:10 to 10:1), applying power to the inductively coupled antenna of about 1000 W, applying a cathode bias power of about 10 W, and maintaining a wafer temperature of about 40 degrees Celsius at a pressure in the process chamber of about 32 mTorr. For such an embodiment, the duration of the stripping process is between 30 and 120 seconds At step 112, the tunnel layer 208, magnetic stack 210, bottom electrode layer 214, and barrier layer 216 are sequentially plasma etched and removed in the regions 226. Subsequent to step 112, the etch mask is removed (FIG. 2F).

Generally, during step 112, etch processes may be used as are described in detail in U.S. patent applications Ser. No. 10/218,244, filed Aug. 12, 2002, Ser. No. 10/245,130, filed Sep. 16, 2002, and Ser. No. 10/342,087, filed Jan. 13, 2003, which are incorporated herein by reference.

In one embodiment, the magnetic stack 210 may be etched using a plasma comprising a chlorine-based chemistry (e.g., $BCl_3$). Such a process performs a substantially physical etch process that removes (i.e., sputters off) the protective film 211 and tunnel layer 208 prior to etching the layers of the magnetic stack 210.

At step 114, the sequence 100 ends.

Figure 3:
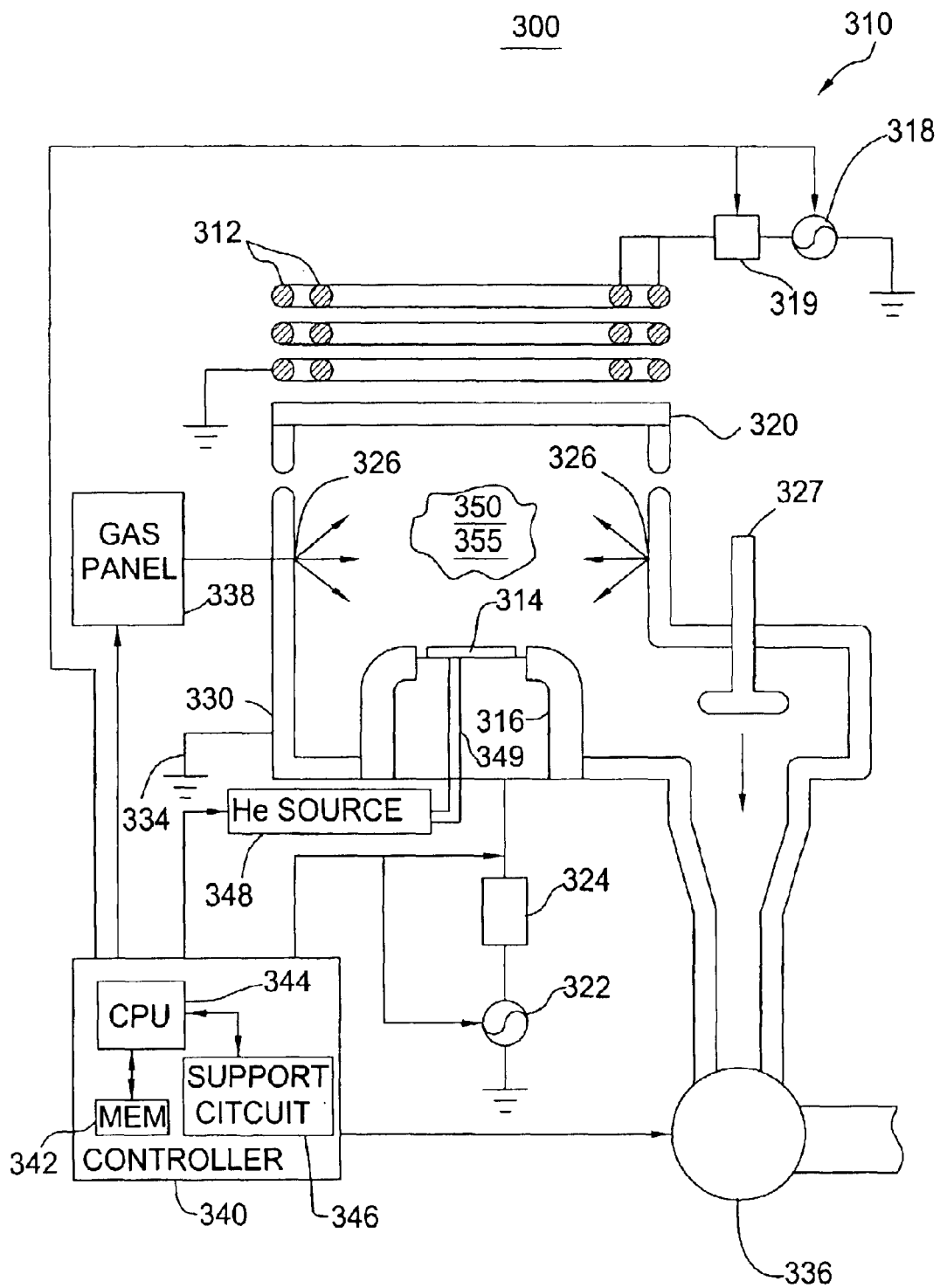
FIG. 3 depicts a schematic diagram of an exemplary plasma processing apparatus of the kind used in performing portions of the inventive method.

One illustrative embodiment of an etch reactor that can be used to perform the steps of the present invention is depicted in FIG. 3. FIG. 3 depicts a schematic diagram of the exemplary Decoupled Plasma Source (DPS) II etch reactor 300 that may be used to practice portions of the invention. The DPS II reactor is available from Applied Materials, Inc. of Santa Clara, Calif.

The reactor 300 comprises a process chamber 310 having a wafer support pedestal 316 within a conductive body (wall) 330, and a controller 340.

The chamber 310 is supplied with a substantially flat dielectric ceiling 320. Other modifications of the chamber 310 may have other types of ceilings, e.g., a dome-shaped ceiling. Above the ceiling 320 is disposed an antenna comprising at least one inductive coil element 312 (two co-axial elements 312 are shown). The inductive coil element 312 is coupled, through a first matching network 319, to a plasma power source 318. The plasma source 318 typically is capable of producing up to 3000 W at a tunable frequency in a range from 50 kHz to 13.56 MHz.

The support pedestal (cathode) 316 is coupled, through a second matching network 324, to a biasing power source 322. The biasing power source 322 generally is capable of producing up to 500 W at a frequency of approximately 13.56 MHz. The biasing power may be either continuous or pulsed power. In other embodiments, the biasing power source 322 may be a DC or pulsed DC source.

The controller 340 comprises a central processing unit (CPU) 344, a memory 342, and support circuits 346 for the CPU 344 and facilitates control of the components of the DPS II etch process chamber 310 and, as such, of the etch process, as discussed below in further detail.

In operation, a semiconductor wafer 314 is placed on the pedestal 316 and process gases are supplied from a gas panel 338 through entry ports 326 to form a gaseous mixture 350. The gaseous mixture 350 is ignited into a plasma 355 in the chamber 310 by applying power from the plasma and bias sources 318 and 322 to the inductive coil element 312 and the cathode 316, respectively. The pressure within the interior of the chamber 310 is controlled using a throttle valve 327 and a vacuum pump 336. Typically, the chamber wall 330 is coupled to an electrical ground 334. The temperature of the wall 330 is controlled using liquid-containing conduits (not shown) that run through the wall 330.

The temperature of the wafer 314 is controlled by stabilizing a temperature of the support pedestal 316. In one embodiment, helium gas from a gas source 348 is provided via a gas conduit 349 to channels (not shown) formed in the pedestal surface under the wafer 314. The helium gas is used to facilitate heat transfer between the pedestal 316 and the wafer 314. During processing, the pedestal 316 may be heated by a resistive heater (not shown) within the pedestal to a steady state temperature and then the helium gas facilitates uniform heating of the wafer 314. Using such thermal control, the wafer 314 is maintained at a temperature of between 0 and 500 degrees Celsius.

Those skilled in the art will understand that other etch chambers may be used to practice the invention, including chambers with remote plasma sources, electron cyclotron resonance (ECR) plasma chambers, and the like.

To facilitate control of the process chamber 310 as described above, the controller 340 may be one of any form of general-purpose computer processor that can be used in an industrial setting for controlling various chambers and sub-processors. The memory, or computer-readable medium, 342 of the CPU 344 may be one or more of readily available memory such as random access memory (RAM), read only memory (ROM), floppy disk, hard disk, or any other form of digital storage, local or remote. The support circuits 346 are coupled to the CPU 344 for supporting the processor in a conventional manner. These circuits include cache, power supplies, clock circuits, input/output circuitry and subsystems, and the like. The inventive method is generally stored in the memory 342 as a software routine. The software routine may also be stored and/or executed by a second CPU (not shown) that is remotely located from the hardware being controlled by the CPU 344.

Figure 4:
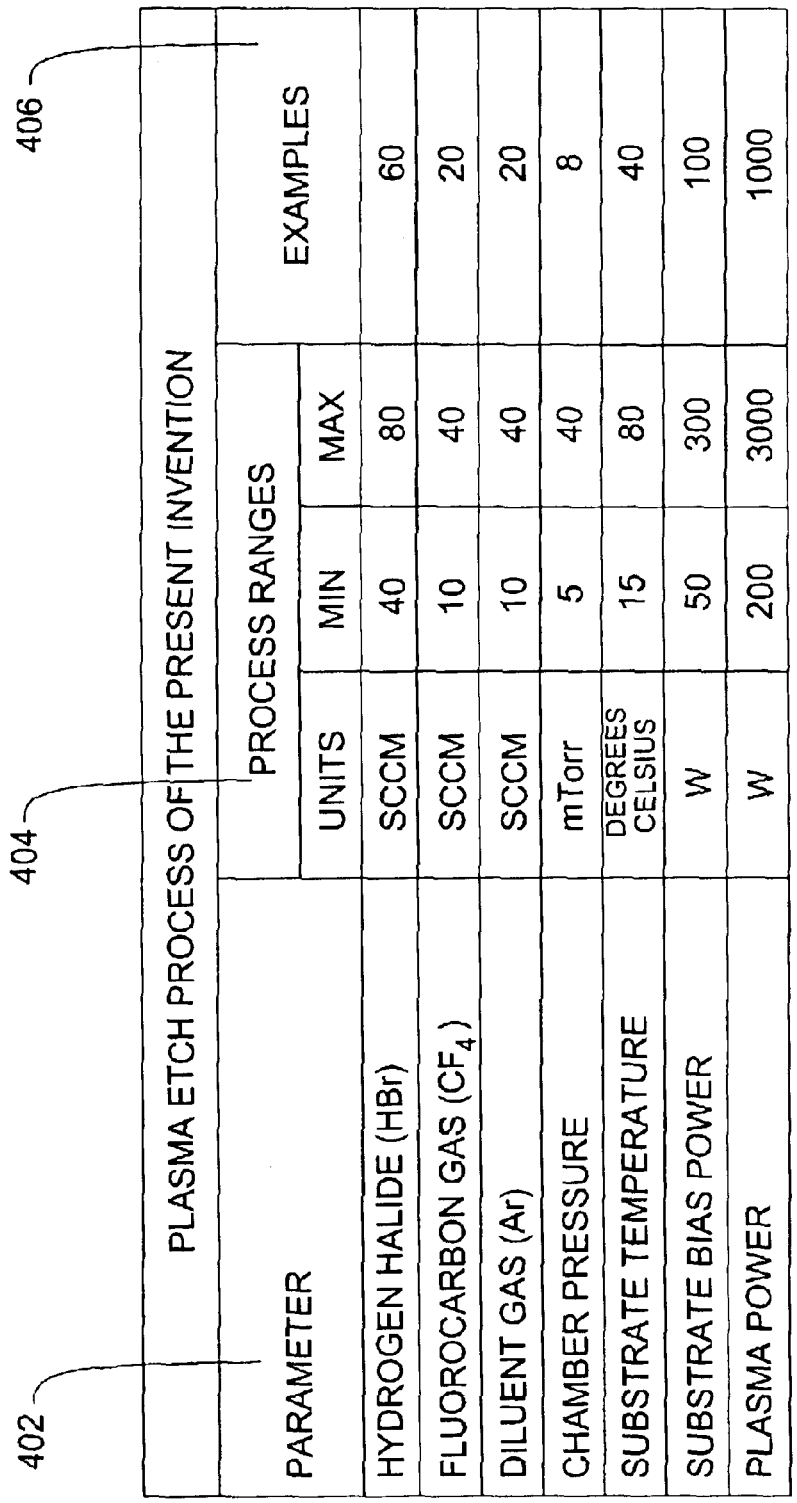
FIG. 4 is a table summarizing the processing parameters of one exemplary embodiment of the inventive method when practiced using the apparatus of FIG. 3.

FIG. 4 is a table 400 summarizing the process parameters of the etch process described herein using the DPS II reactor. The process parameters summarized in column 402 are for one exemplary embodiment of the invention presented above. The process ranges are presented in column 404. Exemplary process parameters for etching the free magnetic layer 220 are presented in column 406. It should be understood, however, that the use of a different plasma etch reactor may necessitate different process parameter values and ranges.

The invention may be practiced using other semiconductor wafer processing systems wherein the processing parameters may be adjusted to achieve acceptable characteristics by those skilled in the art by utilizing the teachings disclosed herein without departing from the spirit of the invention.

Although the forgoing discussion referred to fabrication of the MRAM device, fabrication of the other devices and structures that are used in integrated circuits can benefit from the invention.

While the foregoing is directed to the illustrative embodiment of the present invention, other and further embodiments of the invention may be devised without departing from the basic scope thereof, and the scope thereof is determined by the claims that follow.

What is claimed is:

1. A method of etching a magnetic material, comprising:
   (a) providing a substrate having a layer of a magnetic material thereon;
   (b) forming a patterned mask on the layer of magnetic material; and
   (c) etching the layer of magnetic material using a gas mixture comprising a hydrogen halide gas and a fluorocarbon-containing gas.

2. The method of claim 1 wherein the fluorocarbon-containing gas is selected from the group consisting of carbon tetrafluoride ($CF_4$), trifluoromethane ($CHF_3$), difluoromethane ($CH_2F_2$) and fluoromethane ($CH_3F$).

3. The method of claim 1 wherein the magnetic material comprises at least one of NiFe and CoFe.

4. The method of claim 1 wherein step (c) provides an etch selectivity for the magnetic material over a dielectric material of about 15:1.

5. The method of claim 1 wherein step (c) provides an etch selectivity for the magnetic material over a photoresist patterned mask of about 0.2:1.

6. The method of claim 1 wherein the gas mixture of step (c) comprises the hydrogen halide gas and the fluorocarbon-containing gas at a hydrogen halide:fluorocarbon-containing gas flow ratio within a range of about 1:1 to 8:1.

7. The method of claim 6 wherein the gas mixture further comprises a diluent gas.

8. The method of claim 7 wherein the diluent gas comprises one or more gases selected from the group consisting of argon (Ar), helium (He) and neon (Ne).

9. The method of claim 6 wherein the fluorocarbon-containing gas is selected from the group consisting of carbon tetrafluoride ($CF_4$), trifluoromethane ($CHF_3$), difluoromethane ($CH_2F_2$) and fluoromethane ($CH_3F$).

10. The method of claim 6 wherein the magnetic material comprises at least one of NiFe and CoFe.

11. The method of claim 1 wherein the gas mixture further comprises a diluent gas.

12. The method of claim 11 wherein the diluent gas comprises one or more gases selected from the group consisting of argon (Ar), helium (He) and neon (Ne).

13. The method of claim 11 wherein the gas mixture of step (c) comprises the hydrogen halide and the diluent gas at a hydrogen halide to diluent gas flow ratio within a range of about 1:1 to 8:1.

14. The method of claim 1 wherein step (c) further comprises:
   providing hydrogen bromide (HBr) and carbon tetrafluoride ($CF_4$) at an HBr:$CF_4$ flow ratio within a range of about 1:1 to 8:1;
   providing argon (Ar) at an HBr:Ar flow ratio within a range of about 1:1 to 8:1;
   maintaining the substrate at a temperature of about 15 to about 80 degrees Celsius;
   applying a plasma power of about 200 W to about 3000 W;
   applying a substrate bias power of about 50 W to about 300 W; and
   maintaining a process chamber pressure within a range of about 5 mTorr to about 40 mTorr.

15. The method of claim 1 wherein the hydrogen halide gas is selected from the group consisting of hydrogen bromide (HBr), hydrogen chloride (HCl), and hydrogen fluoride (HF).

16. The method of claim 1 wherein the hydrogen halide gas comprises hydrogen bromide (HBr).

17. The method of claim 16 wherein the fluorocarbon-containing gas is selected from the group consisting of carbon tetrafluoride ($OF_4$), trifluoromethane ($CHF_3$), difluoromethane ($CH_2F_2$) and fluoromethane ($CH_3F$).

18. The method of claim 16, wherein the hydrogen bromide gas and the fluorocarbon-containing gas of the gas mixture of step (c) is provided at a hydrogen bromide:fluorocarbon-containing gas flow ratio within a range of about 1:1 to 8:1.

19. A method of fabricating a magneto-resistive random access memory (MRAM) device, comprising:
   (a) providing a substrate having a top electrode and a free magnetic layer formed on a film stack comprising a tunnel layer, one or more magnetic layers and a bottom electrode;
   (b) forming a patterned mask on the top electrode;
   (c) etching the top electrode; and
   (d) etching the free magnetic layer using a gas mixture comprising a hydrogen halide gas and a fluorocarbon-containing gas.

20. The method of claim 19 wherein the hydrogen halide gas is selected from the group consisting of hydrogen bromide (HBr), hydrogen chloride (HCl) and hydrogen fluoride (HF).

21. The method of claim 19 wherein the fluorocarbon-containing gas is selected from the group consisting of carbon tetrafluoride ($CF_4$), trifluoromethane ($CHF_3$), difluoromethane ($CH_2F_2$) and fluoromethane ($CH_3F$).

22. The method of claim 19 wherein the magnetic material comprises at least one of NiFe and CoFe.

23. The method of claim 19 wherein step (d) provides an etch selectivity for the magnetic material over the tunnel layer of about 15:1.

24. The method of claim 19 wherein step (d) provides an etch selectivity for the magnetic material over a photoresist patterned mask of about 0.2:1.

25. The method of claim 19 wherein a protective film is formed on the tunnel layer during step (d).

26. The method of claim 25 wherein the tunnel layer comprises aluminum oxide ($Al_2O_3$) and the protective film comprises aluminum fluoride ($AlF_x$).

27. The method of claim 19 wherein the gas mixture of step (d) comprises the hydrogen halide and fluorocarbon-containing gas at a hydrogen halide:fluorocarbon-containing gas flow ratio within a range of about 1:1 to 8:1.

28. The method of claim 19 wherein the gas mixture further comprises a diluent gas.

29. The method of claim 28 wherein the diluent gas comprises one or more gases selected from the group consisting of argon (Ar), helium (He) and neon (Ne).

30. The method of claim 28 wherein the gas mixture of step (d) comprises the hydrogen halide and diluent gas at a hydrogen halide:diluent gas flow ratio within a range of about 1:1 to 8:1.

31. The method of claim 19 wherein step (d) further comprises:

providing hydrogen bromide (HBr) and carbon tetrafluoride ($CF_4$) at an $HBr:CF_4$ flow ratio within a range of about 1:1 to 8:1;

providing argon (Ar) at an HBr:Ar flow ratio within a range of about 1:1 to 8:1;

maintaining the substrate at a temperature of about 15 to about 80 degrees Celsius;

applying a plasma power of about 200 W to about 3000 W;

applying a substrate bias power of about 50 W to about 300 W; and maintaining a process chamber pressure within a range of about 5 mTorr to about 40 mTorr.

32. The method of claim 19 wherein the hydrogen halide gas comprises hydrogen bromide (HBr).

33. The method of claim 32 wherein the fluorocarbon-containing gas is selected from the group consisting of carbon tetrafluoride ($CF_4$), trifluoromethane ($CHF_2$), difluoromethane ($CH_2F_2$) and fluoromethane ($CH_3F$).

34. The method of claim 33 wherein the hydrogen bromide gas and the fluorocarbon-containing gas of the gas mixture of step (c) is provided at a hydrogen bromide:fluorocarbon-containing gas flow ratio within a range of about 1:1 to 8:1.

35. A computer-readable medium containing instructions that when executed by a computer causes a semiconductor wafer processing system to etch a magnetic material using a method comprising:

(a) forming a patterned mask on a layer of magnetic material disposed on a substrate; and (b) etching the layer of magnetic material using a gas mixture comprising a hydrogen halide gas and a fluorocarbon-containing gas.

36. The computer-readable medium of claim 35 wherein the fluorocarbon-containing gas is selected from the group consisting of carbon tetrafluoride ($CF_4$), trifluoromethane ($CHF_3$), difluoromethane ($CH_2F_2$) and fluoromethane ($CH_3F$).

37. The computer-readable medium of claim 35 wherein the magnetic material comprises at least one of NiFe and CoFe.

38. The computer readable medium of claim 35 wherein the hydrogen halide gas is selected from the group consisting of hydrogen bromide (HBr), hydrogen chloride (HCl), and hydrogen fluoride (HF).

* * * * *

UNITED STATES PATENT AND TRADEMARK OFFICE
CERTIFICATE OF CORRECTION

PATENT NO. : 6,911,346 B2
DATED : June 28, 2005
INVENTOR(S) : Chentsau Ying et al.

It is certified that error appears in the above-identified patent and that said Letters Patent is hereby corrected as shown below:

Column 8,
Line 39, after "tetrafluoride" delete "($OF_4$)," and insert -- ($CF_4$), --.

Column 10,
Line 7, after "trifluoromethane" delete "($CHF_2$)," and insert -- ($CHF_3$), --.

Signed and Sealed this

Twenty-fourth Day of January, 2006

JON W. DUDAS
*Director of the United States Patent and Trademark Office*